(12) United States Patent
Berger et al.

(10) Patent No.: US 8,018,148 B2
(45) Date of Patent: Sep. 13, 2011

(54) LIGHT-EMISSIVE DEVICE HAVING CO-EVAPORATED CATHODE

(75) Inventors: Paul Berger, Newark, DE (US); Jeremy Henley Burroughes, Cambridge (GB); Julian Charles Carter, Cambridge (GB); Stephen Karl Heeks, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 12/172,721

(22) Filed: Jul. 14, 2008

(65) Prior Publication Data

US 2009/0033214 A1   Feb. 5, 2009

Related U.S. Application Data

(63) Continuation of application No. 09/857,698, filed on Nov. 9, 2001, now Pat. No. 7,400,090.

(30) Foreign Application Priority Data

Dec. 8, 1998 (GB) .................................. 9827014.3
Jan. 21, 1999 (GB) .................................. 9901334.4
Dec. 7, 1999 (GB) ....................... PCT/GB99/04050

(51) Int. Cl.
  *H05B 33/00* (2006.01)
  *H05B 33/26* (2006.01)
  *H01J 9/00* (2006.01)
(52) U.S. Cl. ............ 313/506; 313/504; 445/24; 445/46; 428/690; 428/917
(58) Field of Classification Search .................. 313/504, 313/506; 445/24, 25
See application file for complete search history.

(56) References Cited

U.S. PATENT DOCUMENTS

| | | | |
|---|---|---|---|
| 4,539,507 A | 9/1985 | VanSlyke et al. | |
| 5,132,750 A | 7/1992 | Kato | |
| 5,157,468 A | 10/1992 | Matsumoto | |
| 5,652,067 A | 7/1997 | Ito et al. | |
| 5,674,636 A | 10/1997 | Dodabalapur et al. | |
| 5,776,622 A * | 7/1998 | Hung et al. .................. | 428/690 |

(Continued)

FOREIGN PATENT DOCUMENTS

EP   0430041 A1   6/1991

(Continued)

OTHER PUBLICATIONS

S. Dirr et al., "Organic-Electro-and Photoluminescent Microcavity Devices," Advanced Materials, DE, VCH Verlagsgesellschaft, Weinheim, vol. 10, No. 2, Jan. 22, 1998, pp. 167-171, XP000727865.

(Continued)

*Primary Examiner* — Sikha Roy
(74) *Attorney, Agent, or Firm* — Rissman Hendricks & Oliverio, LLP

(57) ABSTRACT

A light-emissive device comprising: a light-emissive region (12); a first electrode (10) located on a viewing side of the light-emissive region for injecting charge carriers of a first type: and a second-electrode (11) located on a non-viewing side of the light-emissive region for injecting charge carriers of a second type; and wherein there is a reflectivity-influencing structure (13) located on the non-viewing side of the light-emissive region and including a light absorbent layer comprising graphite and/or a fluoride or oxide of a low work function metal.

8 Claims, 3 Drawing Sheets

U.S. PATENT DOCUMENTS

Figure 1:
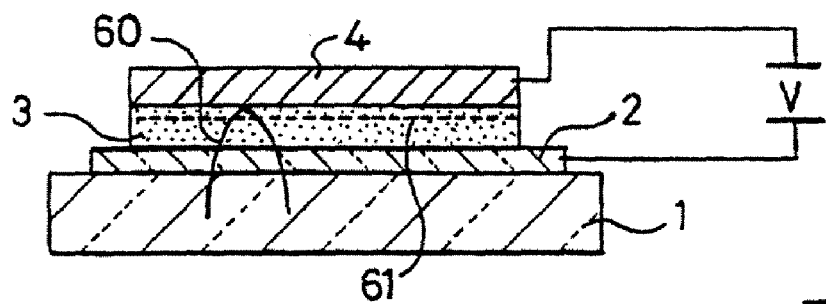

| | | | |
|---|---|---|---|
| 5,834,893 A | | 11/1998 | Bulovic et al. |
| 5,949,186 A | | 9/1999 | Nagayama et al. |
| 5,969,474 A | | 10/1999 | Arai |
| 6,114,055 A | * | 9/2000 | Choong et al. ............... 428/690 |
| 6,121,727 A | * | 9/2000 | Kanai et al. .................. 313/504 |
| 6,132,280 A | * | 10/2000 | Tanabe et al. ................... 445/58 |
| 6,153,254 A | * | 11/2000 | Young et al. .................... 427/66 |
| 6,278,236 B1 | * | 8/2001 | Madathil et al. .............. 313/504 |
| 6,410,168 B1 | | 6/2002 | Tamura |

FOREIGN PATENT DOCUMENTS

| | | |
|---|---|---|
| EP | 0483783 A2 | 5/1992 |
| EP | 0838976 A1 | 4/1998 |
| GB | 2074787 A | 11/1981 |
| GB | 2106317 A | 4/1983 |
| GB | 2133927 A | 8/1984 |
| GB | 2176340 A | 12/1986 |
| GB | 2297647 A | 8/1996 |
| JP | 03-163882 | 7/1991 |
| JP | 06005367 A | 1/1994 |
| JP | 08008065 A | 1/1996 |
| JP | 08222374 A | 8/1996 |
| JP | 10-125469 | 5/1998 |
| WO | WO90/13148 | 11/1990 |

OTHER PUBLICATIONS

A. Gyoutoku et al., "An organic Electroluminescent Dot-Matrix Display Using Carbon Underlayer," Proceedings of the 1997 International Conference on Electroluminescence of Molecular Materials and Related Phenomena, Fukuoka, Japan, May 21-24, 1997, vol. 91, No. 1-3, May 21, 1997, pp. 73-75, XP000890057.

G. Jabbour et al., "Aluminum Based Cathode Structure for Enhanced Electron Injection in Electroluminescent Organic Devices," Applied Physics Letters, US, American Institute of Physics, New York, vol. 73, No. 9, Aug. 31, 1998, pp. 1185-1187, XP000781203.

Korean Patent Office Action of Jul. 29, 2003 in corresponding Application No. 7007191/2001.

Michaelson H., "The work function of the elements and its periodicity", J. Appl. Phys., vol. 48, No. 11, Nov. 1977, p. 4729-4733.

English Translation of Office Action dated Oct. 7, 2003 from the Japanese Patent Office in corresponding Japanese Application No. 2000-587391.

* cited by examiner

LIGHT-EMISSIVE DEVICE HAVING CO-EVAPORATED CATHODE

This invention relates to display devices.

One specific class of display devices is those that use an organic material for light emission. Light-emissive organic materials are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emissive material is a polymer. In U.S. Pat. No. 4,539,507 the organic light-emissive material is of the class known as small molecule materials, such as (a-hydroxyquinoline)aluminum ("Alq3"). In a practical device one of the electrodes is typically transparent, to allow the photons to escape the device.

FIG. 1 shows the typical cross-sectional structure of an organic light-emissive device ("OLED"). The OLED is typically fabricated on a glass or plastic substrate 1 coated with a transparent first electrode 2 such as indium-tin-oxide ("ITO"). Such coated substrates are commercially available. This ITO-coated substrate is covered with at least a layer of a thin film of an electroluminescent organic material 3 and a final layer forming a second electrode 4, which is typically a metal or alloy. Other layers can be added to the device, for example to improve charge transport between the electrodes and the electroluminescent material.

If light that is incident on the display can be reflected back towards a viewer, especially from the region of pixels that are intended to appear dark, then the apparent contrast between the pixels of the display can be reduced. This reduces the effectiveness of the display.

Many display devices are used in applications where power consumption is a crucial consideration—examples are battery-powered devices such as portable computers and mobile phones. There is therefore a drive to improve the efficiency of display devices.

According to one aspect of the present invention there is provided a light-emissive device comprising: a light-emissive region; a first electrode located on a viewing side of the light-emissive region for injecting charge carriers of a first type; and a second electrode located on a non-viewing side of the light-emissive region for injecting charge carriers of a second type: and wherein there is a reflectivity-influencing structure located on the non-viewing side of the light-emissive region and including, a light absorbent layer comprising graphite and/or a fluoride or oxide of a low work function metal.

According to a second aspect of the present invention there is provided a light-emissive device comprising: a light-emissive region; a first electrode located on a viewing side of the light-emissive region for injecting charge carriers of a first type; and a second electrode located on a non-viewing side of the light-emissive region for injecting charge carriers of a second type; and wherein there is a reflectivity-influencing structure located on the non-viewing side of the light-emissive region and including a light-reflective layer and a light-transmissive spacing layer between the second electrode and the light-reflective layer, the thickness of the spacing layer being such as to space a reflective plane of the light-reflective layer by approximately half the wavelength of the optical mode of the device from at least part of the light-emissive region.

The first electrode is preferably at least partially light-transmissive, most preferably substantially transparent, at least to light of some or all of the wavelengths that can be emitted from the device. The first electrode could, for example, be formed of ITO (indium-tin oxide), TO (tin oxide) or gold. The first electrode is preferably disposed in a viewing direction from the light-emissive region—that is between the light-emissive region and an expected location of a viewer. The first electrode may be in the form of a layer. Where the device includes more than one pixel more than one first electrode could be provided to allow (in co-operation with the second electrode) each pixel to be individually addressed.

The second electrode may be at least partially light-transmissive, suitably substantially transparent, at least to light of some or all of the wavelengths that can be emitted from the device. This could be achieved by forming the second electrode from a light-transmissive material and/or by the second electrode being relatively thin, for example less than 2, 5, 10, 20 or 30 nm in thickness. Suitable materials for the second electrode include lithium, calcium and ITO. Alternatively, the second electrode could be reflective or non-reflective/light absorbent. In that case, the second electrode preferably itself provides the reflectivity-influencing structure. Where the second electrode is light-absorbent it could be formed of a light-absorbent materials such as a fluoride or oxides of a low work function metal such as Li, Ca, Mg, Cs, Ba, Yb, Sm eta (together, optionally, with a conductive material such as Al, which could be co-deposited with the oxide or fluoride), or of a low work function metal Incorporating and preferably co-deposited with a light-absorbent material such as carbon (graphite). The said low work function metal may have a work function below 4.0 eV. The said low work function metal may have a work function below 3.5 eV. The said low work function metal may have a work function below 3.2 eV. The said low work function metal may have a work function below 3.0 eV. A suitable range of thickness for the second electrode is in the range from 50 to 1000 nm, preferably from 100 to 300 nm.

The first electrode and/or the second electrode preferably comprise electrically conductive material, for example metallic material. One of the electrodes (the hole-injecting electrode) preferably has a work function of greater than 4.3 eV. That layer may comprise a metallic oxide such as indium-tin oxide ("ITO") or tin oxide ("TO") or a high work function metal such as Au or Pt This may be the first electrode or the second electrode. The other electrode (the electron-injecting electrode) preferably has a work function less than 3.5 eV. That layer may suitably be made of a metal with a low work function (Ca, Ba, Yb, Sm, Li etc.) or an alloy or multi-layer structure comprising one or more of such metals together optionally with other metals (e.g. Al). This may be the second electrode or the first electrode. The rear electrode is preferably at least partially light-absorbent. This may be achieved by incorporating a layer of light-absorbent material such as carbon in the electrode. Such material is preferably also electrically conductive.

The reflectivity-influencing structure could be located adjacent the second electrode. The reflectivity-influencing structure then suitably influences the reflectivity of the rear (non-viewing side) of the device, being (for example) substantially light-absorbent or substantially light-reflective. The reflectivity-influencing structure /nay include distinct substantially light-absorbent and substantially light-reflective areas.

In the first aspect of the invention the reflectivity-influencing structure may comprise a light-absorbent layer. Such a layer is suitably for reducing reflection by or through the second electrode of light emitted from the light-emissive region and/or absorbing light that has been transmitted through the second electrode and/or absorbing light that is incident on the device from another source. Such a light-absorbent layer is preferably located adjacent to the second electrode; alternatively the light-absorbent layer could be spaced from the second electrode, for example by an insulating material. The presence of the reflectivity-influencing structure adjacent or more generally behind the second electrode suitably renders the second electrode substantially non-reflective to light emitted from the light-emissive region. Such a light-absorbent layer Is preferably formed from a light-absorbent material—for example the light-absorbent layer of the reflectivity-influencing structure could comprise graphite. Where the device comprises a plurality of individual pixels the light-absorbent layer is preferably common to a plurality of pixels.

In the second aspect of the invention the reflectivity-influencing structure may comprise a light-reflective layer. Such a layer is suitably for influencing the coincidence within the device of the optical field (e.g. an anti-node of the optical field) and a part of the light-emissive region. Such a part of the light-emissive region is suitably a region at which there is some or significant electron/hole recombination (preferably to generate photons). The said part is preferably a principal recombination site or plane of the light-emissive layer. The said part is most preferably the peak recombination site or plane of the device. The reflectivity-influencing structure preferably comprises a light-transmissive spacing layer between the second electrode and such a light-reflective layer, suitably for spacing the light-reflective layer from the light-emissive layer and preferably by a predetermined spacing. The spacing layer could be provided by material integral with the second electrode itself - for example by virtue of the thickness of the second electrode. The thickness of the spacer is preferably such as to space a reflector of the reflection-influencing structure from at least part of the light-emissive region by approximately half the wavelength of the optical mode of the device. That reflector may be one of the major surfaces of the reflective layer (those closer to and further from the light-emissive layer) or may be a reflective structure (such as a distributed Bragg reflector) defined by the reflective layer. The thickness of the spacer is most preferably such as to space the reflector by approximately or substantially half the wavelength of the optical mode of the device from the region of the light-emissive region at which the optical field is approximately or substantially at its peak.

The light-absorbent or light-reflecting layers mentioned above of the reflection-influencing structure are preferably in optical communication with the light-emissive layer of the device so that light from the light-emissive layer may reach the light-absorbent or light-reflecting layers.

The reflection-influencing structure is preferably electrically conductive, suitably to permit electrical contact to be made to the second electrode through the reflection influencing structure.

According to a third aspect of the present invention there is provided a light-emissive device comprising: a light-emissive region; a first electrode located on a viewing side of the light-emissive region for injecting charge carriers of a first type; and a second electrode located on a non-viewing side of the light-emissive region for injecting charge carriers of a second type; and a contrast enhancing structure located on the non-viewing side of the light-emissive region and including a reflective structure having different reflectivity for different wavelengths of incident light, and having a reflectivity peak encompassing an emission wavelength of the light-emissive region. In this aspect of the invention the reflective structure is suitably a distributed Bragg reflector. In this aspect of the invention the second electrode suitably comprises a layer located on the non-viewing side of the reflective structure and a plurality ,of through paths passing through the reflective structure for electrical conduction between the said layer of the second electrode and the light-emissive region. The through paths preferably occupy less than 15% or less than 10% of the emissive area of the device. The through paths may occupy between 15% and 5% of the emissive area of the device. In this aspect of the invention the cathode may comprise a transparent layer located between the reflective structure and the light-emissive region. That transparent layer may be in contact with the through paths.

In general, the light-emissive material is suitably an organic material and preferably a polymer material. The light-emissive material is preferably a semiconductive and/or conjugated polymer material. Alternatively the light-emissive material could be of other types, for example sublimed small molecule films or inorganic light-emissive material. The or each organic light-emissive material may comprise one or more individual organic materials, suitably polymers, preferably fully or partially conjugated polymers. Example materials include one or more of the following in any combination: poly(p-phenylenevinylene) ("PPV"), poly(2-methoxy-5(2'-ethyl)hexyloxyphenylene-vinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene))("TFB"), poly(2,7-(9,9-di-n -octylfluorene)-(1,4-phenylene-((4-methylphenyl)imino)-1,4-phenylene-((4-methylphenyl)imino) -1,4-phenylene)) ("PFM"), poly(2,7-(9,9-di-n-octylfluorene-((4-methoxyphenyl)imino)-1,4-phenylene-((4-methoxyphenyl)imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT"). Alternative materials include small molecule materials such as Alq3.

One or more charge-transport layers may be provided between the light-emissive region and one or both of the electrodes. The or each charge transport layer may suitably comprise one or more polymers such as polystyrene sulphonic acid doped polyethylene dioxythiophene ("PEDOT-PSS"), poly(2,7-(9,9-di-n -octylfluorene)-(1,4-phenylene-(4-imino(benzoic acid)-1,4-phenylene-(4-imino(benzoic acid)) -1,4-phenylene)) ("BFA"), polyaniline and PPV.

Any implied physical orientation of the device is not necessarily related to its physical orientation during use or manufacture.

Figure 2:
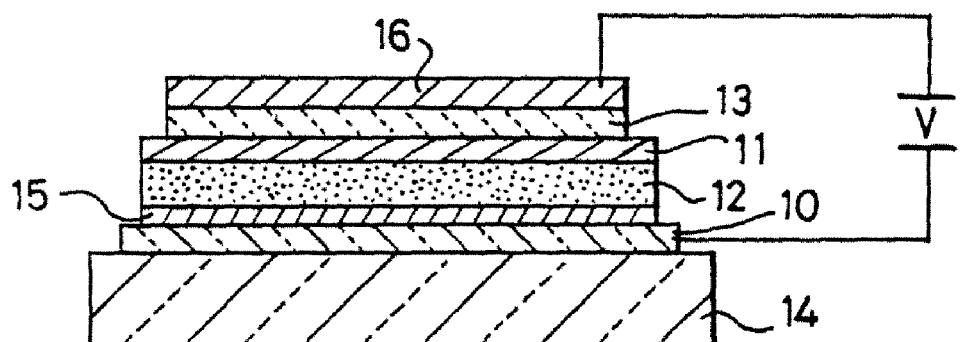
Figure 3:
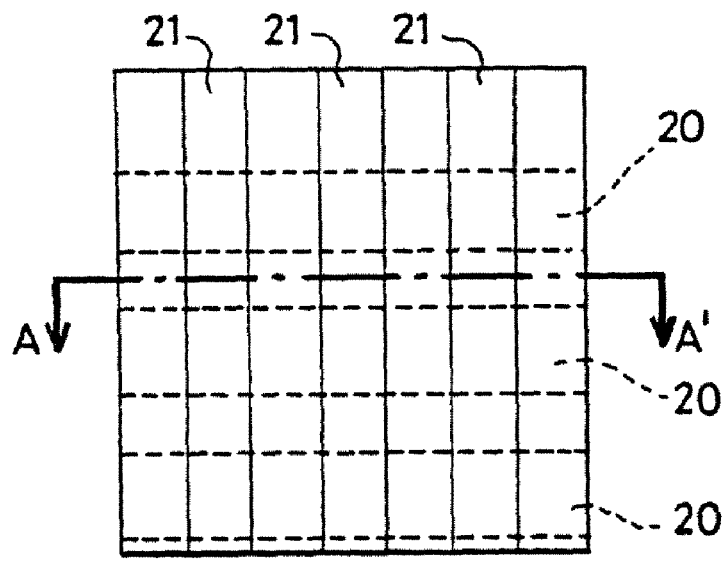
Figure 4:
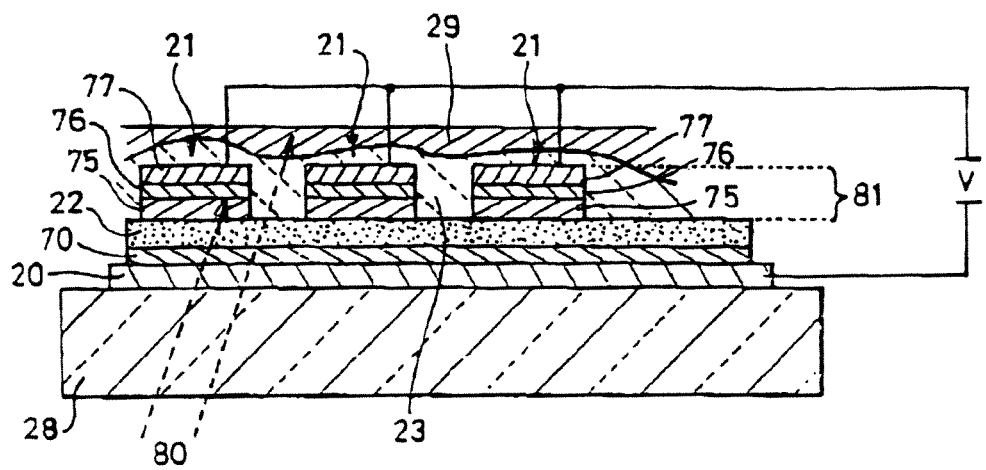
Figure 5:
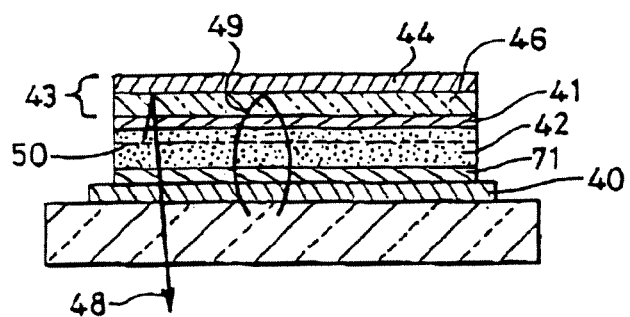
Figure 6:
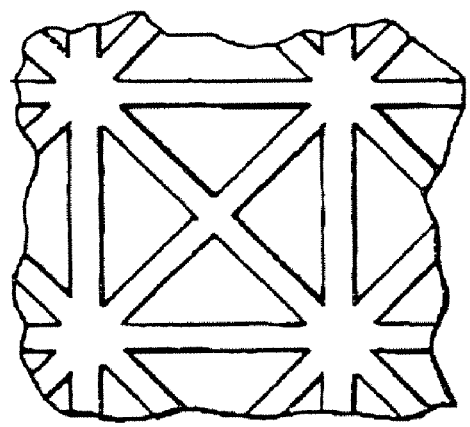
Figure 7:
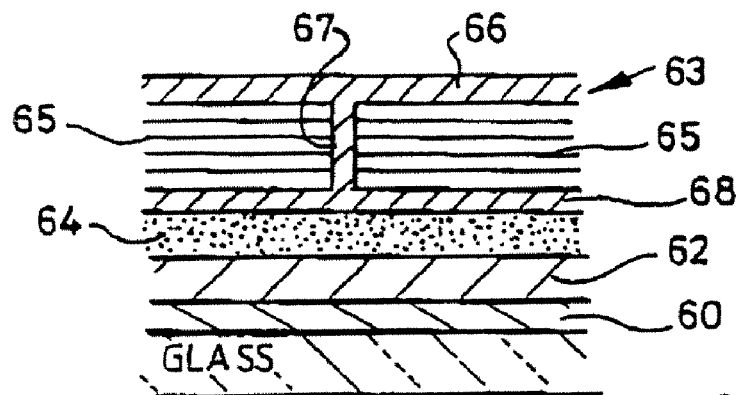
Figure 8:
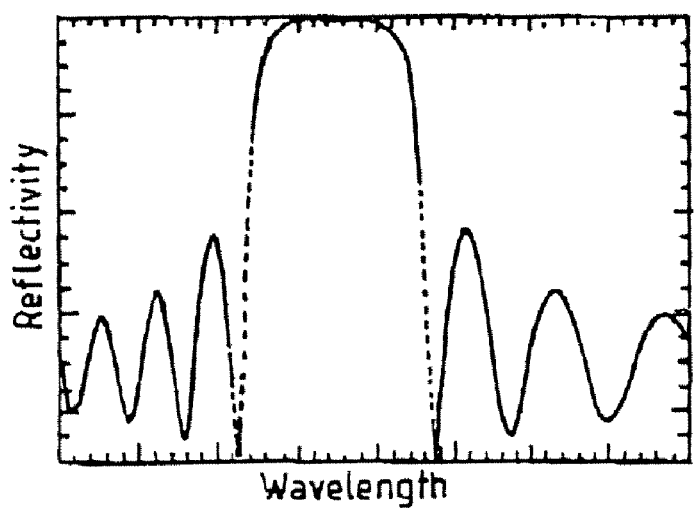

The present invention will now be described by way of example with reference to the accompanying drawings, in which:

FIG. 2 is a cross-section of a first device;
FIG. 3 is a plan view of a second device;
FIG. 4 is a cross-section of the device of FIG. 3 on the line A-A'; and
FIG. 5 is a cross-section of a third device;
FIG. 6 is a plan view of a fourth device;
FIG. 7 is a cross-section of the fourth device; and
FIG. 8 shows the reflectivity of a DBR against wavelength.
The figures are not to scale.

The device of FIG. 2 comprises an anode electrode layer 10, and a cathode electrode 11. Located between the electrode layers is a layer 12 of light-emissive material. The anode electrode is formed of transparent ITO. The cathode electrode is formed of calcium. The cathode is sufficiently thin that it is not significantly reflective. Behind the cathode is a layer 13 of carbon. When a suitable voltage is applied across the electrodes light is emitted from the light-emissive material substantially omnidirectionally. Some of the light is emitted forwards towards the anode and passes directly out of the device through the anode. Some of the light is emitted backwards towards the cathode. Incident light that shines on to the display from an external source can be absorbed by the carbon layer 13. Because this light is absorbed it does not reflect back towards a viewer—this can improve the effect produced by the display, as described in detail below.

The device of FIG. 2 may be formed starting with a commercially-available glass sheet coated with ITO. The glass sheet (14 in FIG. 2) forms the substrate for subsequent deposition steps. The glass sheet could be a sheet of sodalime or borosilicate glass of a thickness of, for instance, 1 mm. Instead of glass other materials such as Perspex could be used. The thickness of the ITO coating is suitably around 100 to 150 nm and the ITO suitably has a sheet resistance of between 10 and 30 */Φ. Over the ITO anode is deposited a hole transport or injecting layer 15. The hole transport layer is formed from a solution containing PEDOT:PSS with a ratio of PEDOT to PSS of around 1 to 5. The thickness of the hole transport layer is suitably around 50 nm. The hole transport layer is spin-coated from solution and then baked typically at 200° C. for 1 hour in a nitrogen environment. Then an electroluminescent layer 12 comprising 20% TFB in 5BTF8 is coated over the hole transport layer by spin-coating typically to a thickness of 90 nm. The term 5BTF8 refers to poly (2,7-(9,9-di-n-octylfluorene) ("F8") doped with 5% poly-(2, 7-(9,9-di-n-octylfluorene)-3,6-benzothiadiazole) ("F8BT"). Then a transparent or semitransparent layer of a low work function material such as calcium is thermally evaporated on to the electroluminescent layer in vacuo at a base pressure of less than $10^{-8}$ mbar to form the cathode layer 11. The thickness of this layer is preferably greater than around 1 nm but less than the thickness at which the calcium layer would be non-transparent—typically around 20 nm. Over this layer is deposited by electron beam evaporation a layer 13 of carbon with a thickness of between 100 and 500 nm at base pressures less than $10^{-8}$ mbar. On this layer is deposited by sputter deposition a layer 16 of aluminum with a thickness of between 100 and 1000 nm at base pressures less than $10^{-8}$ mbar. In this embodiment the low work function layer 11 is chosen to act as an efficient electron injector for injecting electrons into the light-emissive region. The carbon layer 13 acts as a light-absorbing layer yet has a conductivity that is low enough not to significantly increase the drive voltage of the device. The sputtered aluminum layer 16 acts as an encapsulant, having a compact morphology with low pinhole density and small grain size. Contacts can be attached to the device (between layers 15 and 10) and it can finally be sealed in epoxy resin for environmental protection.

FIGS. 3 and 4 show a multi-pixel display device that makes use of the principle described above in connection with the device of FIG. 2. The device of FIGS. 3 and 4 comprises a set of parallel anode electrode strips 20 in a common anode plane and a set of parallel cathode electrode strips 21 in a common cathode plane spaced from the anode plane. Between the anode and cathode electrodes is a light-emissive layer 22. The areas where anode and cathode electrode strips overlap define pixels of the display device. By using a passive matrix addressing scheme individual pixels can be caused to emit light (The device could alternatively be configured to allow active matrix or other addressing schemes to be used). FIG. 4 shows that each cathode electrode comprises three layers: an injection layer 75 of a low work function material such as calcium adjacent to the emissive layer 22, an intermediate layer 76 of a light-absorbent material such as carbon (graphite) and a conduction layer 77 of a highly conductive material such as aluminum. Together these make up a cathode plane 81. In general, the injection layer is suitably of a material that has good properties of injection into the light-emissive layer 22; the Intermediate layer is suitably of a material that has good light-absorbency properties and the conduction layer is of a highly conductive material. The conduction layer may be significantly thicker than the other layers and preferably helps to distribute charge evenly along the electrode structure. Where the material chosen for one of the layers can also perform the function of another layer then that other layer could be emitted. For instance, if the selected light emissive material were one into which good charge injection could be achieved from carbon then the layer 75 could be omitted, and/or if the layers 75 and/or 76 provided adequate conduction then the layer 77 could be omitted. The light absorbent layer 76 preferably lies between the other two layers (where present), in which case it should be electrically conductive, but it could lie behind the other two layers Alternatively, or in addition, a light absorbent layer covering the whole structure could be provided (layer 29 in FIG. 4). If that layer were of a conductive material such as carbon then an insulating layer 23 could be provided to prevent shorting between the cathode strips 21.

The effect of the light-absorbent layer 76 is to absorb light that is incident on the display and could otherwise be reflected from the display causing a reduction in contrast. This is illustrated by light rays 80 in FIG. 4, which are absorbed by layers 23 and 29. The light-absorbent layer therefore helps to increase contrast. The light-absorbent layer may also help to reduce transmission within the device itself of light emitted from the light-emissive layer 22. This can help to increase contrast by avoiding such light emerging from the device at a location where it appears to come from a different pixel from the one from which it was emitted.

One of the contacts from the display driver is applied to the layer 77.

A carbon layer or other non-reflective layer could also be provided in front of the light-emissive layer 22 in the lateral spaces between the pixels to further reduce reflection of ambient light.

The principles described above In relation to the devices of FIGS. 2 to 4 can therefore improve contrast between adjacent pixels of a device and improve the pattern of light emission from a single pixel by reducing emission of more obliquely angled light and reducing reflection of ambient light FIG. 5 shows another display device. The device of FIG. 5 comprises an anode electrode layer 40, and a cathode electrode 41. Located between the electrode layers is a layer 42 of light-emissive material. The anode electrode and the cathode electrode are formed of transparent ITO. Alternatively, for example, the electrodes could be formed from a thin layer of a low work function metal such as calcium adjacent to an transparent spacing layer formed from a material such as ITO, ZnSe, ZnS etc.). When a suitable voltage is applied across the electrodes light is emitted from the light-emissive material substantially omnidirectionally. Some of the light is emitted forwards towards the anode and passes directly out of the device through the anode. Some of the light is emitted backwards towards the cathode, through which It passes into a reflection structure indicated generally at 43. The reflection structure comprises a reflective layer 44 and a transparent spacing layer 46. The spacing, layer lies between the cathode 41 and the reflective layer 44 and spaces the reflective layer from the light-emissive region 42. The reflective layer reflects backwardly emitted light forwards so that it can pass back through the cathode electrode 41, the light-emissive layer 42 the anode electrode 40 and the glass substrate 47 and out of the device (see ray 43).

In FIG. 5 curve 49 illustrates the form of the optical field and region 50 illustrates the zone in the device at which electron/hole recombination to generate photons is most intense. The equivalent features are illustrated at 60 and 61 respectively for the device of FIG. 1. The thickness of the spacing layer in the device of FIG. 5 is ideally chosen so that the plane (or one of the planes) of the reflective layer 44 that acts to return backwardly emitted light is spaced from the emissive layer by a distance such that at least one emission frequency of the device the peak of the optical mode of the whole reflective arrangement (see curve 49) coincides with the region of peak electron/hole recombination in the light-emissive layer of the device. The effect of this is to arrange that the area of light generation in the device is at a more efficient plane of the device of FIG. 5 than in the device of FIG. 1, by tuning the peak of the optical field (anti-node) to coincide with the hole/electron recombination zone of the emissive layer. This optimises (or at least partially optimises) the location for efficient light generation for a given wavelength. The wavelength for which the device is optimised preferably is or is near the peak intensity emission wavelength. This ideal arrangement calls for very precise spacing of the respective layers; however, considerable benefits can be gained by arranging the layers approximately or substantially in that way.

The device of FIG. 5 may be formed by a similar route to that described above for the device of FIG. 2 up to the formation of the cathode electrode. Then for the device of FIG. 5 the spacing layer 46 is termed by depositing ITO, ZnSe, ZnS or the like to the required thickness, preferably on top of a thin layer of a low work-function metal such as calcium. Over the ITO spacing layer the reflective layer 44 is formed from reflective material such as aluminum. In an alternative embodiment a conducting dielectric stack next to or spaced from the cathode could be used as the reflector. Such a stack could be formed, for example, of alternating layers of ITO and NiO.

In another alternative embodiment, one of the electrodes could be formed of a reflectivity influencing material. The anode or the cathode could be reflective or non-reflective (light-absorbent). This could be achieved by choosing a material with the desired reflectivity properties and the preferred charge conduction and injection properties. An electrically suitably material could be treated (e.g. by surface treatment or incorporation into it of a reflectivity influencing additive) to obtain the desired reflectivity properties.

One specific example Is for the rear electrode (the one furthest from a viewer) to be non-reflective. In a device arranged generally as those in FIGS. 1 to 5, this calls for a non-reflective cathode. (In other devices the anode may be the rear electrode). One suitable material for a reflective or non-reflective cathode is LIF:Al. When the Al component of a LiF:Al film is greater than 50% the LiF:Al films are reflective. When the Al component is between 50% and 30% the films are non-reflective. When the Al component is <30% the films are semi-transparent but also have very high resistivities. Therefore, in the range 50:50 to 70:30 LiF:Al LiF/Al films are useful for making a black (non-reflective) cathode.

An example device having a non-reflective rear electrode (in this case the cathode) can be manufactured as follows. On to a glass substrate a 150 nm thick layer of ITO is deposited to act as an anode electrode. Then a 50 nm thick layer of PEDOT/PSS is deposited to act as a hole transport layer. Over that an 80 nm thick layer of a polyfluorene based electroluminescent polymer is formed. Finally the non-reflective cathode layer is deposited as a 200 nm thick layer of co-evaporated LiF and Al, with the LIF:Al evaporation rates being 60:40. On top of this layer a 400 nm thick Al layer is deposited. In varying this specific design of device it should be noted that the range of potential thickness for the LiF:Al layer depends on the composition since the greater the proportion of LiF in the layer the more transparent the layer becomes. For layers of composition 60:40 LiF:Al 200 nm is just thick enough. A suitable range of thickness is from 50 to 1000 nm.

Alternative nor.-reflective cathode materials include generally fluorides and oxides of low work function metals such as Li, Ca, Mg, Cs, preferably together with an inherently highly conductive metal such as Al or Cu (although in some situations Cu may be less preferred because of its tendency to quench polymers' electroluminescence). Specific examples include CsF, MgF, CaF, LIO, CaO, which could be co-evaporated with Al or sputtered from a composite target Including Al. The required ratios of the conductor (Al) with the insulating fluorides and oxides can easily be determined by experimentation in each case but might be expected to be similar to those discussed for the LiF:Al system above. Another alternative route to a low reflectivity or non-reflective or cathode is to co-evaporate or sputter a low work function material with carbon. Examples include the low work function metals Ca, Li etc and also the fluorides and oxides listed above.

FIG. 6 is a plan view and FIG. 7 a cross-sectional view of another alternative device. The device comprises an anode electrode 60, a hole transport layer 62, a cathode electrode 63, a light-emissive layer 64 and a distributed Bragg reflector (DBR) layer 65. The DBR is located on the non-viewing side of the light-emissive layer. The bulk (66) of the cathode 63 is located on the non-viewing side of the DBR. To allow charge to pass from the bulk of the cathode to the light-emissive region cathode vias 67 are provided through the DBR. The vias occupy a relatively small proportion of the area of the device: for example around 15% to 5%. To even out charge injection into the emissive layer a further layer 68 of the cathode which is sufficiently thin to be transparent is provided between the DBR and the light-emitting region. If the DBR were conductive, or the vias were closely spaced, or uniformity could otherwise be achieved then the layer 68 could be omitted. The mesh-like arrangement of vias (see FIG. 6) could be formed by means of deposition through a shadow mask.

A DBR comprises of a stack of regularly alternating higher- and lower-refractive index, dielectrics (light transmissive materials) fabricated to fulfill the Bragg condition for reflection at particular wavelengths. This occurs when the optical path of the periodicity in the dielectric stack corresponds to half a wavelength, and the reflectivity is further optimised when the DBR stack obeys the following equation:

$$\tfrac{1}{2}\lambda = n_1 d_1 + n_2 d_2,$$

where $n_1$, $n_2$ are the respective refractive indices; $d_1$, $d_2$ are the corresponding component film thicknesses in the DBR; and $\lambda$ is the desired reflection wavelength. FIG. 8 shows the reflectivity of a DBR against wavelength, the reflectivity peaking at that optimum and being much lower for other wavelengths.

In the device of FIGS. 6 and 7 the DBR is arranged so that the emission wavelength of the light-emissive layer (or its principal emission wavelength) lies within the reflectivity peak of the DBR, and most preferably at or near the maximum reflectivity of the DBR. The effect of this is that the DBR can act to increase the contrast of tine device without significantly reducing its efficiency. Light emitted rearwards from the light-emissive layer is reflected efficiently (e.g. with around 95% to 100% reflectivity) back towards a viewer by the DBR. Incident light that is not at or near the emission wavelength of the light-emitting layer, and therefore not within the reflectivity peak of the DBR, is reflected much less (e.g. only 5% to 10%) and tends to be absorbed by the DBR, improving the contrast of the device. The peaky reflectivity of the DBR may also serve to enhance colour purity of the emission from the device.

The vias may be reflective to a range of wavelengths, so it is preferred to minimise the area occupied by the vias, for example to below 15% and preferably below 10%.

Some variations on the devices described above will now be described. In any of the devices one or more charge transport layers (e.g. layers 15, 70, 71) may be formed between the light-emissive layer and either or both of the electrodes to assist charge transport between the respective electrode and the light-emissive layer and/or to resist charge transport in the opposite direction. The principles described above could be applied to other types of organic or inorganic display devices. One specific alternative example is the class of display devices that use sublimed molecular films for light emission, as described for example in "Organic Electroluminescent Diodes", C. W. Tang and S. A. VanSlyke, Appl. Phys. Lett 51, 913-915 (1987). The locations of the electrodes could be reversed so that the cathode is located at the front of the display (closest to the viewer) and the anode is at the back. Other materials or classes of materials could be used instead of those mentioned above, although this may impair performance of the devices.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A method of manufacturing a light-emissive device, the method comprising:
   depositing an anode;
   depositing a light-emissive region; and
   depositing a cathode by co-evaporating barium metal and a fluoride or oxide of a low work function metal so as to reduce reflectivity of the cathode.

2. A method according to claim 1, wherein the fluoride or oxide of a low work function metal is a fluoride.

3. A method according to claim 1, wherein depositing the cathode further comprises depositing aluminum.

4. A method according to claim 3, wherein the aluminum forms a separate layer.

5. A light-emissive device comprising:
   an anode;
   a light-emissive region; and
   a low or non-reflective cathode comprising a mixture of co-evaporated barium metal and a fluoride or oxide of a low work function metal.

6. A light-emissive device according to claim 5, wherein the fluoride or oxide of a low work function metal is a fluoride.

7. A light-emissive device according to claim 5, wherein the cathode further comprises aluminum.

8. A light-emissive device according to claim 7, wherein the aluminum forms a separate layer.

* * * * *